(12) United States Patent
Kaule et al.

(10) Patent No.: US 6,382,677 B1
(45) Date of Patent: May 7, 2002

(54) SECURITY ELEMENT AND METHOD FOR PRODUCING SAME

(75) Inventors: Wittich Kaule, Emmering; Gregor Grauvogl, München; Jürgen Schützmann, Pfaffenhoffen; Friedrich Kretschmar, München, all of (DE)

(73) Assignee: Giesecke & Devrient GmbH, Munich (DE)

( * ) Notice: Subject to any disclaimer, the term of this patent is extended or adjusted under 35 U.S.C. 154(b) by 0 days.

(21) Appl. No.: 09/308,680

(22) PCT Filed: Sep. 10, 1998

(86) PCT No.: PCT/EP98/05787

§ 371 Date: Aug. 4, 1999

§ 102(e) Date: Aug. 4, 1999

(87) PCT Pub. No.: WO99/19152

PCT Pub. Date: Apr. 22, 1999

(30) Foreign Application Priority Data

Oct. 10, 1997 (DE) .......................... 197 44 953

(51) Int. Cl.[7] .................................................. B42D 15/00
(52) U.S. Cl. ........................ 283/107; 283/91; 283/94; 283/83; 428/40.9
(58) Field of Search ............................ 283/72, 91, 92, 283/94, 86, 82, 83, 98, 113, 903, 904, 107; 428/332, 40.1, 41.7, 40.9

(56) References Cited

U.S. PATENT DOCUMENTS 5,130,192 A * 7/1992 Takabayashi et al. ....... 428/332
5,388,862 A * 2/1995 Edwards .................. 283/91 X
5,815,292 A * 9/1998 Walters ................... 283/91 X

* cited by examiner

*Primary Examiner*—Willmon Fridie, Jr.
(74) *Attorney, Agent, or Firm*—Bacon & Thomas

(57) ABSTRACT

The invention relates to a security device having at least one plastic layer and one specularly reflecting metal layer. An inorganic auxiliary layer is disposed between the plastic layer and the metal layer.

17 Claims, 2 Drawing Sheets

SECURITY ELEMENT AND METHOD FOR PRODUCING SAME

Figure 1:
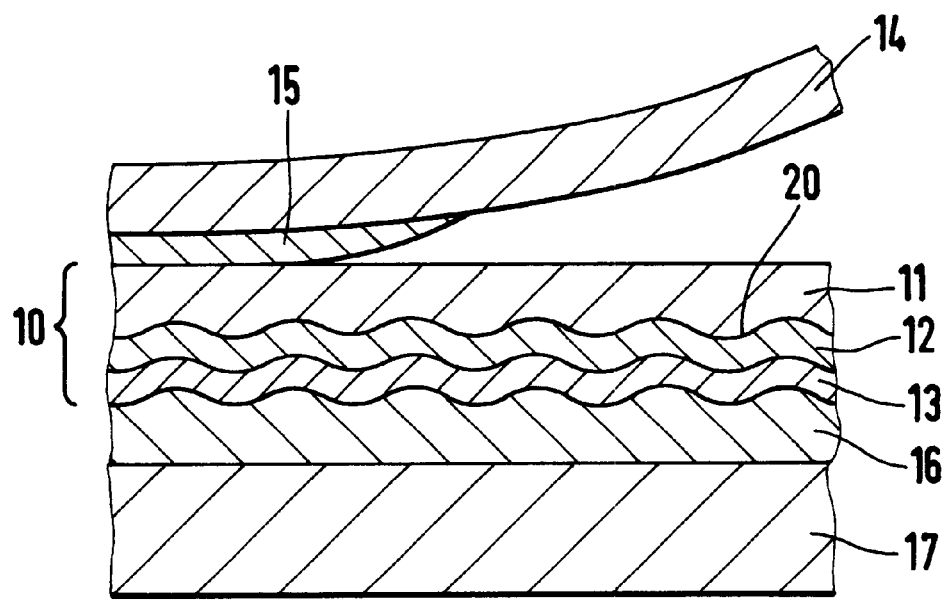

This invention relates to a security device having at least one crosslinkable plastic layer and one specularly reflecting metal layer. The invention further relates to a foil material and a to method for producing said foil material.

Optically variable devices, such as holograms, diffraction gratings, etc., have been used for some time for protection against forgery or copy protection by reason of their optical properties varying with the viewing angle. For mass production of such devices it is usual to produce so-called "masters" which have the particular phase information in the form of a three-dimensional relief structure. Starting out from this master one produces by duplication so-called "embossing dies" which are used for embossing a long run of the required diffraction structures. Such embossed holograms are usually prepared on a separate carrier as multilayer devices and transferred by means of an adhesive layer to the final object to be protected against falsification, such as a document, passport, credit card, CD, etc. The carrier layer can be removed from the layer structure of the hologram after the latter has been glued to the object to be protected.

The multilayer device applied to the carrier material can be produced e.g. by the method known from U.S. Pat. No. 4,758,296. A sheetlike embossing die circulating on rollers is provided with liquid resin and brought in contact with a plastic carrier material. Simultaneously the liquid resin is cured by means of UV or electron radiation. In a further step the relief structure is provided with a thin metal layer so that the hologram can be observed in reflected light. For transfer to a security document the layer structure is finally provided with a hot-melt adhesive layer which is activated under the action of heat and pressure.

However it has turned out that with the use of embossing lacquers crosslinkable by UV rays the metal layer does not adhere optimally to the embossing lacquer layer. In view of the high requirements placed on the durability of security devices, an improvement of the metal adhesion is desirable not only for UV-cured embossing lacquers but in general also for other lacquers.

The invention is therefore based on the problem of proposing a security device or foil material, and a method for producing it, which ensures improvement of the adhesion of the metal layer to plastic layers.

This problem is solved by the independent claims. Developments are the object of the subclaims.

The essence of the invention is that one or more inorganic auxiliary layers are disposed between the plastic layer and the metal layer. An auxiliary layer here is a thin layer of an element or a compound of elements from main groups III. and IV and subgroups 4 to 6 of the periodic system. In particular one can use, as elements, the metals Ti and Cr and, as compounds, oxides of the elements Al, Ti, Zr, Sn, Be, preferably $Al_2O_3$, $TiO_2$ or $Cr_2O_3$. However one can also use nitrides, borides or carbides, such as TiN, WC. Pure metal alloys, such as NiCr, are also suitable as auxiliary layers for improving metal adhesion on plastics.

It is important in the inventive use that the auxiliary layers lie between the viewer and the reflecting layer of the reflecting security devices. The auxiliary layers are made so thin according to the invention that they do not hinder the reflection of the reflecting layer, i.e. the optical density of the auxiliary layer is in the order of magnitude of 1 or less. With metals such as chromium, or slightly transparent compounds such as TiN, this means that the layer is thinner than 10 nm, preferably in the order of magnitude of 0.5 nm to 5 nm. With very transparent materials, such as $Al_2O_3$ or $TiO_2$, the layer must in any case be so thin that the hologram embossing is not filled up, i.e. also generally less than 10 nm. The auxiliary layer can be vapor-deposited or sputtered or applied by other methods, such as PVD (physical vapor deposition) or CVD (chemical vapor deposition) or by photo-CVD, reactive and plasma-enhanced coating methods.

As a reflecting layer one preferably uses aluminum because it is the only metal that can be vapor-deposited cheaply with high reflection and low price. Other metals showing high reflection, such as gold or silver, are expensive; other cheap metals have lower reflection than aluminum but can of course likewise be used depending on the intended use of the security device.

According to a preferred embodiment, the layer structure of the inventive security device is prepared on a carrier layer and the security device then transferred to the object to be protected in the desired form by the transfer method. A plastic foil, such as polyester, is coated in a continuous process with a lacquer layer crosslinkable by UV radiation. An optically variable structure, e.g. diffraction structures in the form of a relief structure, is transferred into this lacquer layer with the aid of an embossing die. The diffraction structures can constitute for example genuine holograms or grating structures, such as cinegrams, pixelgrams, etc.

During the embossing process the lacquer layer is crosslinked by the action of UV radiation. As an auxiliary layer one finally vapor-deposits or sputters on a thin chromium layer which has very good adhesion to the crosslinkable lacquer. To avoid impairing the sharpness of the embossing and thus the brilliance of the optically variable security device, the chromium layer is applied with an optical density of only 0.05, which corresponds roughly to a layer thickness of 1 nm. Over this layer one vapor-deposits an aluminum layer of high reflectivity with an optical density of 2. The adhesive layer necessary for transfer to the object to be protected can likewise be applied to the foil material. It can cover the aluminum layer all over or only in part.

The invention is not restricted to the use of UV-curable lacquers, however. One can use any other embossing layers, such as lacquers initiated by UV light or cured by blue light. The same applies to the adhesive layer. For example one can use hot-melt adhesives or likewise crosslinkable plastic layers.

If adhesion problems likewise occur between the metal layer and the adhesive layer, one can also dispose an auxiliary layer between these layers according to the invention.

According to a further preferred embodiment one uses a transparent auxiliary layer of aluminum oxide instead of the reflecting chromium layer. This layer is deposited on the plastic layer for example by reactive sputtering. Aluminum is sputtered in a very thin oxygen atmosphere of for example 0.02 mb. The layer thickness of the aluminum oxide layer is subsequently a few nm.

The metal layer can additionally be executed in the form of characters or patterns or have gaps in the form of characters or patterns. The partial metalization is usually produced during production of the foil material, e.g. by applying the metalization on the auxiliary layer only in partial areas, e.g. with the aid of masks. Other methods provide all-over metalization which is subsequently removed in the unwanted areas. The auxiliary layer can likewise be removed as well so that it exerts no influence on the optical impression of the device. The same applies when the auxiliary layer is not removed but is transparent and has a refractive index similar to the embossed layer. If the auxiliary layer has high refractive power or an inherent color, however, it can also be used selectively for the optical design of the device.

Using the thus produced foil material one can finally apply security devices with any contours to objects to be protected, such as bank notes, ID cards, as well as other products to be protected against falsification, such as CDs, books, etc.

As mentioned above, however, the invention can be used not only in the case of optically variable security devices but wherever metals adhere poorly to lacquer layers. Thus, one can also perform metal vapor deposition on other security elements such as security threads for bank notes by the above-described method if adhesion problems occur between a metal layer and a directly adjacent plastic layer.

Further examples of the inventive security device will be explained in more detail with reference to the figures. It is pointed out that the figures are intended only for illustration and are not true to scale.

Figure 2:
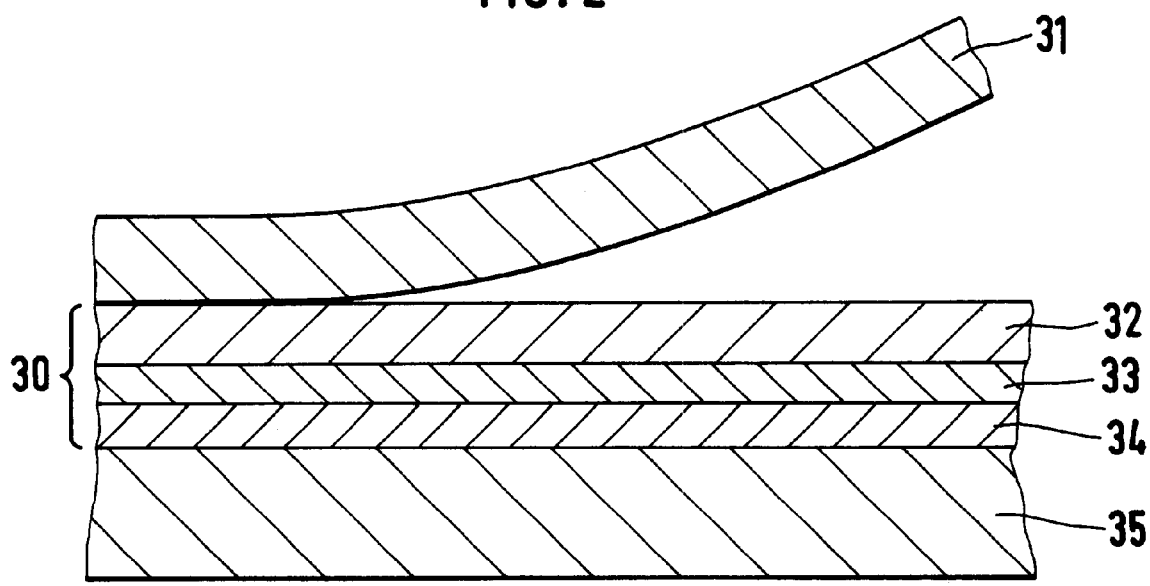
Figure 3A:
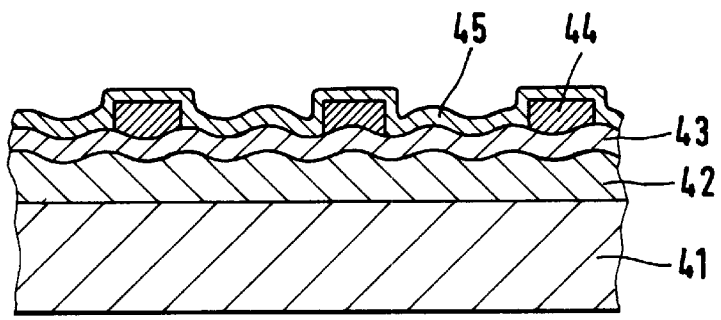
Figure 4A:
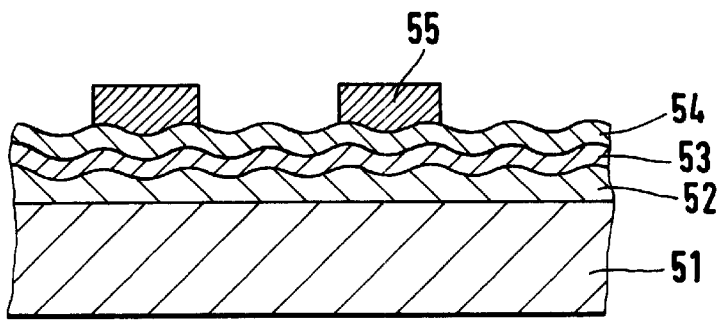

FIG. 1 shows a layer sequence during the transfer process of a diffraction structure to a substrate in cross section, FIG. 2 shows a layer sequence in cross section during transfer of a metal layer to a substrate, FIGS. 3a, b show cross sections of the layer sequence during production of a partial metalization by the antistick method, FIGS. 4a, b show cross sections of the layer sequence during production of a partial metalization by the etching method.

FIG. 1 shows the layer sequence during the transfer process of security device 10 with diffraction structure 20 to substrate 17. The layer structure of security device 10 to be transferred was prepared on separate carrier foil 14 in endless form. Carrier foil 14 was first provided with release layer 15 ensuring easy and defined detachment of security device 10 during the transfer process. The layer sequence of security device 10 was disposed on this layer. It consists of plastic layer 11, in particular a lacquer layer curable by UV radiation, in which diffraction structure 20 was embossed in the form of a relief structure. In order to make diffraction structure 20 visible in reflected light, specularly reflecting metal layer 13, such as an aluminum layer, is provided on embossed lacquer layer 11. To ensure good adhesion between plastic layer 11 and aluminum layer 13, auxiliary layer 12 is disposed according to the invention between lacquer layer 11 and metal layer 13. The transfer of security device 10 takes place with the aid of adhesive layer 16 which is either already disposed on the carrier foil or applied shortly before transfer to substrate 17. This layer may likewise be a crosslinkable lacquer layer, e.g. a cationically curing lacquer, a blue-light curing lacquer or a lacquer crosslinkable by other radiation. One can of course likewise use the hot-melt adhesives usually employed, which provide proper adhesion to the substrate under the action of heat and pressure.

The invention is in no way restricted to the use of UV-curable lacquers with respect to embossing lacquer layer 11 either. Any other lacquers can be used.

If adhesion problems likewise occur between metal layer 13 and adhesive layer 16, one can also provide an auxiliary layer between these layers according to the invention.

Release layer 15 on carrier foil 14 is not obligatory. Whether it is used and, if so, what kind of layer is used depends on the particular adhesion conditions between carrier foil and lacquer layer.

Instead of the vacuum deposition method one can of course apply the reflecting metal layer, which need not necessarily consist of aluminum, by another method such as galvanizing.

In some cases it may also be advantageous to produce security device 10 directly on the document material. For this purpose one applies the embossing lacquer directly to the substrate and embosses it with the diffraction structure there. After the embossing process the adhesion-promoting auxiliary layer is applied as thinly as possible by any method and provided with the aluminum layer, for example by the vacuum deposition method. Further layers can optionally be provided on the metal layer, such as a protective layer or a further auxiliary layer between metal layer and protective layer.

FIG. 2 shows a variant of the invention wherein a metal layer is transferred to a substrate by means of a lacquer layer. Security device 30 is likewise prepared on carrier foil 31 in endless form and then transferred to substrate 35 with the aid of an adhesive layer. Here, too, it can be necessary to provide a release layer between carrier foil 31 and metal layer 32 to be transferred, said release layer not being shown in the figure. Desired metal layer 32 is then vapor-deposited all over carrier foil 31. In order to improve the adhesion of metal layer 32 to lacquer layer 34 acting as an adhesive, metal layer 32 is additionally provided with thin auxiliary layer 33 which, as mentioned above, can be for example a chromium or aluminum oxide layer. Lacquer layer 34 can be applied either to auxiliary layer 33 or to substrate 35. During contact between lacquer layer 34 and substrate 35, lacquer layer 34 is hardened so that the metal layer adheres to substrate 35. Crosslinkable adhesive layers ensure an inseparable bond between substrate and metal layer 32 by reason of the irreversibility of the crosslinking process. In a last step carrier foil 31 can be removed.

The metal layer need not necessarily be provided all over the carrier layer. It can also be applied in the form of characters or patterns or have gaps in the form of characters, patterns or the like. If the auxiliary layer is nontransparent, it should be applied congruently to the metal layer in such a case in order not to disturb the optical impression of the security device. In case the inorganic auxiliary layer is at least partly transparent, however, it can also be used for the optical design of the security device.

FIGS. 3a to 4b show the production of such an inventive foil material containing a plastic layer with an embossed surface and a partial metalization disposed thereupon.

FIG. 3a shows carrier foil 41 which, as described above, was provided with embossing lacquer layer 42 in which a relief structure, such as a diffraction structure, was embossed. Inorganic auxiliary layer 43 was disposed on this embossed layer according to the invention. Then the areas of auxiliary layer 43 intended to be free from metal on finished security device 40 (FIG. 3b) were printed with soluble ink 44. Then, total carrier foil 41 was provided with all-over metalization 45. This layer structure is then treated with a solvent for ink 44 so as to remove ink 44 and metalization 45 located in the area of ink 44.

Figure 3B:
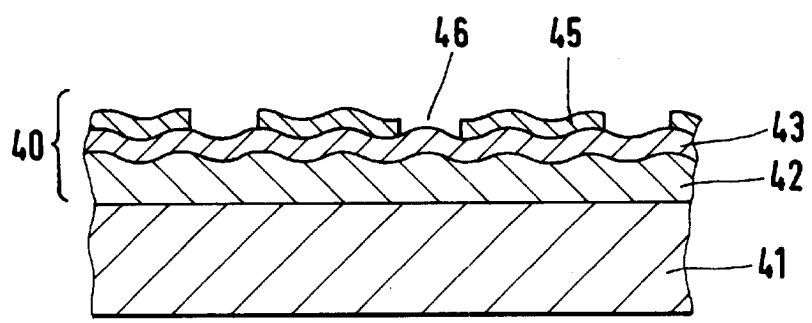

FIG. 3b shows the inventive foil material after the dissolving process. Metalization 45 is now only present in partial areas while inorganic auxiliary layer 43 is still all over. Areas 46 free from metal layer can have the form of letters, patterns or the like, which can appear transparent, partly reflecting or semitransparent depending on the execution of the auxiliary layer. If the auxiliary layer is a metal layer for example, the gaps appear semitransparent by reason of the optical density <1 of the auxiliary layer. With the use of oxides, however, the semitransparency or partial reflection results from their highly refractive properties, in particular if the oxides are executed as so-called "dielectric mirrors." In this case one also obtains special color effects in reflected and transmitted light.

According to a variant, soluble ink 44 can also be printed directly on embossed layer 42 below auxiliary layer 43. In this case not only metal layer 45 is removed but also auxiliary layer 43 located in the area of the ink so that areas 46 free from metal layer appear transparent in any case and are not influenced by the optical properties of auxiliary layer 43.

Figure 4B:
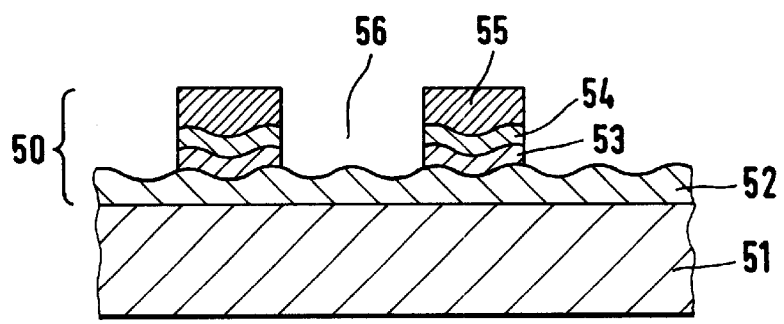

A further method variant for producing the areas free from metal layer will be explained in more detail with reference to FIGS. 4a and 4b. Here, too, carrier foil 51 was provided with embossed plastic layer 52 and inorganic auxiliary layer 53 and all-over metalization 54 (FIG. 4a), Subsequently, solvent-resistant ink 55 was printed in the areas of the metalization intended to remain in security device 50 afterwards. The thus pretreated foil structure is then exposed to a solvent which removes the uncovered areas of metalization 54 and auxiliary layer 53 but not the parts of metalization 54 and auxiliary layer 53 protected by cover layer 55.

FIG. 4b again shows the foil material with finished security device 50. Embossed layer 52 is still present all over while auxiliary layer 53 and metalization 54 are now present only in certain areas, resulting in partial areas 56 free from metal layer. In the shown case, only a small partial area of the embossed structure is provided with metalization 54 and auxiliary layer 53. The metalization can have the form of characters or patterns.

In this example, too, it is of course possible to use a solvent which only dissolves and thus removes metal layer 54 and not auxiliary layer 53.

According to a variant, it is also possible to print the foil material directly with an etching ink, after the all-over metalization was applied, in order to produce the metal layer areas and areas free from metal layer and auxiliary layer.

The foil layer structure with a partial metalization produced in the described way can of course subsequently be provided with further layers, such as further auxiliary layers, adhesive layers or protective layers, depending on the application of the security device.

What is claimed is:

1. A security device having at least one plastic layer and one specularly reflecting metal layer, wherein an inorganic auxiliary layer is disposed between and adjacent the plastic layer and the metal layer and the auxiliary layer consists of a metal, metal compound or metal alloy and the plastic layer has a diffraction structure in the form of a relief structure.

2. A security device according to claim 1, characterized in that the auxiliary layer has a maximum optical density of 1.

3. A security device according to claim 1 or 2, characterized in that the auxiliary layer is an element or a compound of elements from main groups II and IV and subgroups 4 to 6 of the periodic system.

4. A security device according to at least one of claims 1 to 3, characterized in that the auxiliary layer consists of titanium (Ti), chromium (Cr) or titanium nitride (TiN).

5. A security device according to claims 1 to 3, characterized in that the auxiliary layer is an oxide of the elements, aluminum (Al), titanium (Ti), zirconium (Zr), tin (Sn), beryllium (Be), chromium (Cr) or silicon (Si).

6. A security device according to claim 5, characterized in that the auxiliary layer consists of $Al_2O_3$, $TiO_2$ or $Cr_2O_3$.

7. A security device according to at least one of claims 1 to characterized in that the security device has the form of a thread or band.

8. A security device according to at least one of claims 1 to 7, characterized in that the plastic layer is a layer crosslinkable by UV radiation.

9. A security device according to at least one of claims 1 to 8, characterized in that the metal layer is provided only in partial areas.

10. A security device according to at least one of claims 1 to 9, characterized in that the auxiliary layer is disposed congruently to the metal layer.

11. A security device according to at least one of claims 1 to 10, characterized in that the metal layer is likewise provided with an auxiliary layer on the surface facing away from the plastic layer.

12. A security document, comprising at least one security device according to claim 1.

13. A security document according to claim 12, characterized in that the security device is disposed on the surface of the security document.

14. A security document according to claim 12, characterized in that the security device is embedded at least partly in the security document.

15. A security document which is a bank note, comprising at least one security device according to claim 12.

16. A security document which is an ID card, comprising at least one security device according to claim 12.

17. A foil material comprising a plastic foil on which a plastic layer and one specularly reflecting metal layer are diposed and including an inorganic auxiliary layer disposed between and adjacent the plastic layer and the metal layer; said auxiliary layer consisting of a metal, metal compound or metal alloy and said plastic layer has a defraction structure in the form of a relief structure.

* * * * *